(12) United States Patent
Takeguchi et al.

(10) Patent No.: US 7,538,347 B2
(45) Date of Patent: May 26, 2009

(54) THIN FILM TRANSISTOR HAVING A CHANNEL REGION THAT INCLUDES A PLURALITY OF CONNECTING CHANNEL REGIONS

(75) Inventors: Toru Takeguchi, Tokyo (JP); Osamu Miyakawa, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 142 days.

(21) Appl. No.: 11/450,332

(22) Filed: Jun. 12, 2006

(65) Prior Publication Data
US 2006/0284550 A1    Dec. 21, 2006

(30) Foreign Application Priority Data
Jun. 21, 2005   (JP)   ............... 2005-180994

(51) Int. Cl.
*H01L 31/00* (2006.01)
(52) U.S. Cl. .................. 257/59; 257/E27.001
(58) Field of Classification Search ........... 257/59, 257/72, 241, 266, 287
See application file for complete search history.

(56) References Cited

U.S. PATENT DOCUMENTS

| 5,550,066 | A | * | 8/1996 | Tang et al. | 438/29 |
| 5,828,084 | A | * | 10/1998 | Noguchi et al. | 257/65 |
| 6,020,607 | A | * | 2/2000 | Nagai | 257/266 |
| 2003/0209737 | A1 | * | 11/2003 | Mitani et al. | 257/241 |
| 2003/0234395 | A1 | * | 12/2003 | Kokubo et al. | 257/66 |
| 2004/0106237 | A1 | * | 6/2004 | Yamazaki | 438/149 |

FOREIGN PATENT DOCUMENTS

| JP | 7-176753 | 7/1995 |
| JP | 9-74205 | 3/1997 |
| JP | 2002-23697 | 1/2002 |
| JP | 2003-197916 | 7/2003 |
| JP | 2003-332578 | 11/2003 |
| KR | 2000-0074681 | 12/2000 |
| KR | 2003-0087919 | 11/2003 |

OTHER PUBLICATIONS

Machine Translation of KR 10-2003-0087919.*

* cited by examiner

*Primary Examiner*—Jerome Jackson, Jr.
*Assistant Examiner*—Anthony Ho
(74) *Attorney, Agent, or Firm*—Oblon, Spivak, McClelland, Maier & Neustadt, P.C.

(57) ABSTRACT

A thin film transistor includes: an insulation substrate; a semiconductor layer formed on the insulation substrate including, conductive regions that includes impurity, and a channel region sandwiched between the conductive regions; an insulation layer that covers the semiconductor layer; a gate electrode that is formed on the insulator layer at a position where opposes the channel region; and a source electrode and a drain electrode connected to the conductive regions. The channel region divided into a plurality of channel regions and each of channel widths of the plurality of channel regions is in a range from 5 μm to 30 μm.

6 Claims, 5 Drawing Sheets

THIN FILM TRANSISTOR HAVING A CHANNEL REGION THAT INCLUDES A PLURALITY OF CONNECTING CHANNEL REGIONS

BACKGROUND OF THE INVENTION

1. Field of the Invention

The present invention relates to a structure of a thin film transistor used in an electronic device, in particular, a current-driven display device.

2. Description of the Related Art

Recently, an organic electric field light emitting display device that uses self-luminous elements, such as electro luminescence (hereinafter, abbreviated to EL) elements, as electro-optic elements is now coming into general use as one type of display panel. For the organic electric field light emitting display device, there is used a structure in which an EL layer including an organic light emitting layer having the light emitting capability, an EL element including a cathode electrode and an anode electrode formed to sandwich the EL layer to flow a current through the EL layer, and an EL driving thin film transistor (TFT) that supplies a current to the anode electrode are provided for each pixel forming the display region of the device. Because the EL element is provided with the organic light emitting layer that emits light as a current supplied from the EL driving TFT via the anode electrode flows through, it is possible to achieve an appropriate light emitting luminance perceived as display light by adjusting the current.

The luminance of display light from the organic electric field light emitting display device configured as above depends on a quantity of current supplied to the organic light emitting layer. Hence, when the electric characteristic, such as a threshold voltage of the thin film transistor, varies in each thin film transistor, not only a quantity of current, but also the light emitting luminance that depends on a quantity of current is influenced, which results in deterioration of the display characteristic. In other words, because a quantity of current supplied to the organic light emitting layer is quite small and a further minute current has to be controlled for the grayscale display to be achieved, a variance of the electric characteristic in each thin film transistor gives crucial influences. Such being the case, for the organic field effect display device in which the EL element and the EL driving thin film transistor are formed in each pixel, there is used a structure in which plural thin film transistors are formed within each pixel to compensate for a variance, so that variance-induced adverse influences can be suppressed even when the characteristic of the EL driving thin film transistor varies (for example, see JP-A-2002-23697).

SUMMARY OF THE INVENTION

In the organic electric field light emitting display device, by disposing plural thin film transistors that compensate for a variance of the electric characteristic of the thin film transistor, the display characteristic can be improved to some extent but not sufficiently, and there is a further need on the part of the thin film transistor per se to devise a technique for reducing the variance-induced influences. In particular, because a quantity of current supplied to the organic light emitting layer is as small as or smaller than 2 µA, a variance of the characteristic of the thin film transistor used in the voltage-to-current conversion circuit portion that converts a grayscale digital voltage from the EL driving TFT disposed to control a quantity of current or from the outside to a current gives influences directly to the light emitting luminance, and is visually acknowledged as irregular display. This further increases the need to suppress a variance of the current. Driving of the thin film transistor is normally performed in the saturation region. A preferred characteristic to control a minute current as described above with accuracy is therefore a characteristic that the drain voltage dependence of a drain current in the saturation region is small. In the structure of the thin film transistor in the related art, however, the drain current depends on the drain voltage in the saturation region, and for example, when the current-to-voltage characteristic of the thin film transistor is shifted, the current changes correspondingly to the shift, which gives rise to a variation of the light emitting luminance.

The present invention has been made in view of above circumstances and provides a thin film transistor that performs driving in a saturation region in an organic electric field light emitting display device in view of the foregoing. According to an embodiment of the invention, the thin film transistor has a characteristic that the drain voltage dependence of a drain current in the saturation region is small. According to another embodiment of the invention, the thin film transistor make the light emitting luminance uniform in all the pixels of the organic field effect display device by suppressing a variance of current caused by a variance of the electric characteristic in the thin film transistor or the like.

According to an aspect of the invention, there is provided a thin film transistor wherein a channel region is divided to plural regions that use a gate electrode commonly, and a channel width, which is the width of the divided channel region, is in a range of 5 µm to 30 µm both inclusive.

According to the above configuration, it may be possible for the thin film transistor to obtain an electric characteristic that a change of drain current with respect to a drain voltage in a saturation region is small. Thus, it may be possible to deliver a current from the thin film transistor to an organic light emitting layer in a precise manner. An organic field effect display device using the thin film transistor may be thus able to emit light from all the pixels at uniform luminance, which in turn enables a satisfactory display characteristic to be achieved.

DETAILED DESCRIPTION OF THE INVENTION

First Embodiment

Figure 1:
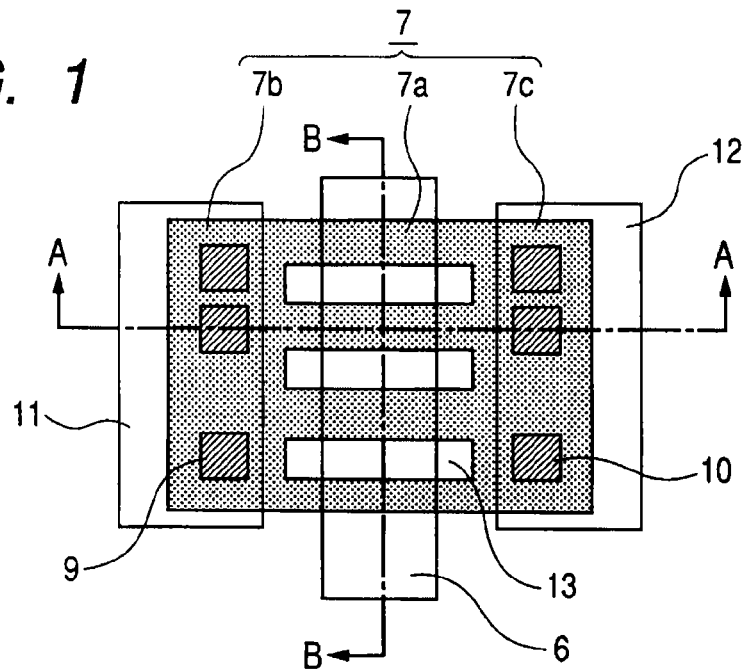
FIG. 1 is a plan view showing a thin film transistor according to a first embodiment of the invention.
Figure 2:
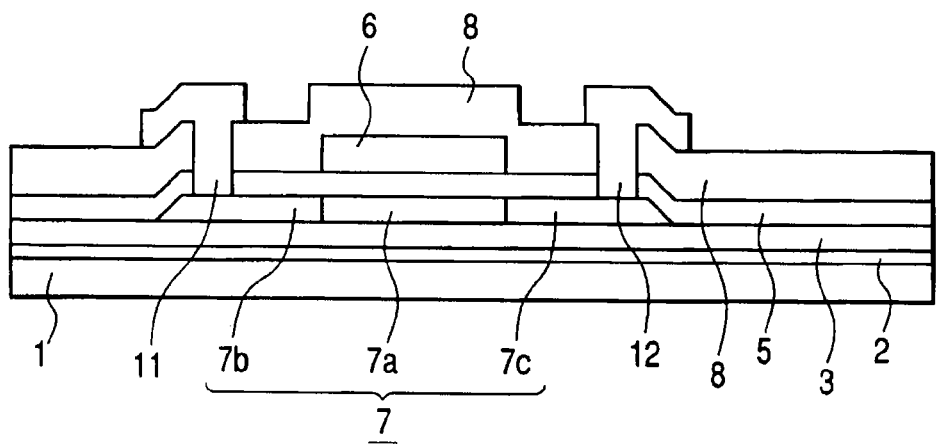
FIG. 2 is a cross section showing the thin film transistor according to the first embodiment of the invention.
Figure 3:
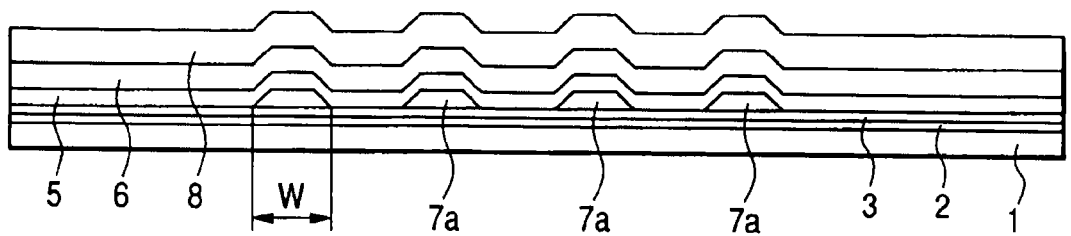
FIG. 3 is a cross section showing the thin film transistor according to the first embodiment of the invention.

A first embodiment will be described with reference to the drawings. FIG. 1 is a plan view showing a thin film transistor according to the first embodiment of the invention. FIG. 2 shows the sectional structure taken along the line A-A of FIG. 1, and FIG. 3 shows the sectional structure taken along the line B-B. The structure of the thin film transistor shown in these drawings includes: a source region 7b and a drain region 7c, which are conductive regions including impurity, formed on a SiN film 2 and a $SiO_2$ film 3 formed on an insulation substrate 1 as light-transmitting insulation films; a channel region 7a formed to be sandwiched between the conductive regions; a polysilicon film 7 made of a semiconductor film having the end portions formed in a tapered shape; a gate insulation film 5 made of an insulation layer formed to cover the foregoing and spread to come into contact with the polysilicon film 7; a gate electrode 6 formed on the gate insulation film 5 oppositely to the channel region 7a; an inter-layer insulation film 8 formed to cover the foregoing; and a source electrode 11 and a drain electrode 12 formed on the inter-layer insulation film 8 and connected, respectively, to the source region 7b and the drain region 7c through contact holes 9 and 10 provided in both the inter-layer insulation film 8 and the gate insulation film 5. Because it is configured in such a manner that the end portions of the polysilicon film 7 are formed in a tapered shape so that it is covered with the gate insulation film 5 in a satisfactory manner, defects, such as a dielectric breakdown, can be suppressed in a satisfactory manner, which contributes to the improvement of the reliability of the thin film transistor. Although it is not shown in the drawing, by providing a flat film having an opening above the drain electrode 12 on the top of the thin film transistor described herein, an anode electrode formed on the flat film to be connected to the drain electrode 12, and an EL layer and a cathode electrode formed on the anode electrode, it is possible to fabricate an organic field effect display device.

Further, as is shown in FIG. 1, the polysilicon film 7 has three slit-shaped openings 13 beneath the gate electrode 6. Because of the presence of the three openings 13, as is shown in FIG. 3, the thin film transistor according to this embodiment of the invention has the structure in which four channel regions 7a each having a channel width W are aligned beneath the common gate electrode 6. In other words, it is understood that the thin film transistor described in the first embodiment of the invention is functionally a thin film transistor in which the channel regions 7a are connected in parallel by commonly using the gate electrode 6 as well as the source region 7b and the drain region 7c, which are conductive regions. As is shown in FIG. 3, the channel width W is a value indicating the measured length of each channel region 7a on the top side where the flat portion comes into contact with the gate insulation film 5, and therefore the portions of a tapered shape is not included. Also, as will be described below, it is preferable that the channel width W is in a range of 5 μm to 30 μm both inclusive.

Hereinafter, descriptions will be given as to how the structure of the thin film transistor described in the first embodiment functions.

Figure 4:
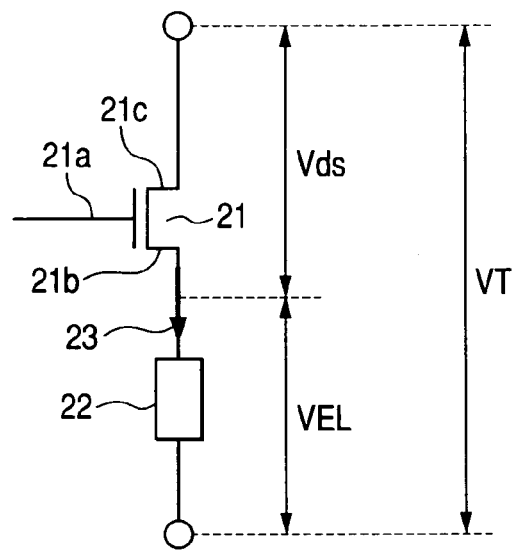
FIG. 4 is a circuit diagram showing a connection state of the thin film transistor and an EL element.

FIG. 4 is a view schematically showing a driving thin film transistor and an EL element connected to the driving thin film transistor in series. Referring to FIG. 4, a gate 21a, a drain 21b, and a source 21c are extended from a thin film transistor 21. An EL element 22 is connected to the drain 21b, and a drain current 23 is flown into the EL element 22 from the drain 21b. Because a voltage VT, which is a sum of a voltage Vds between the source 21c and the drain 21b and a voltage VEL applied to the EL element 22, is normally maintained at a specific constant value, a characteristic view of a drain current Id versus a drain voltage Vd as shown in FIG. 5 is normally used to find the drain current 23 that flows through the current shown in FIG. 4.

Figure 5:
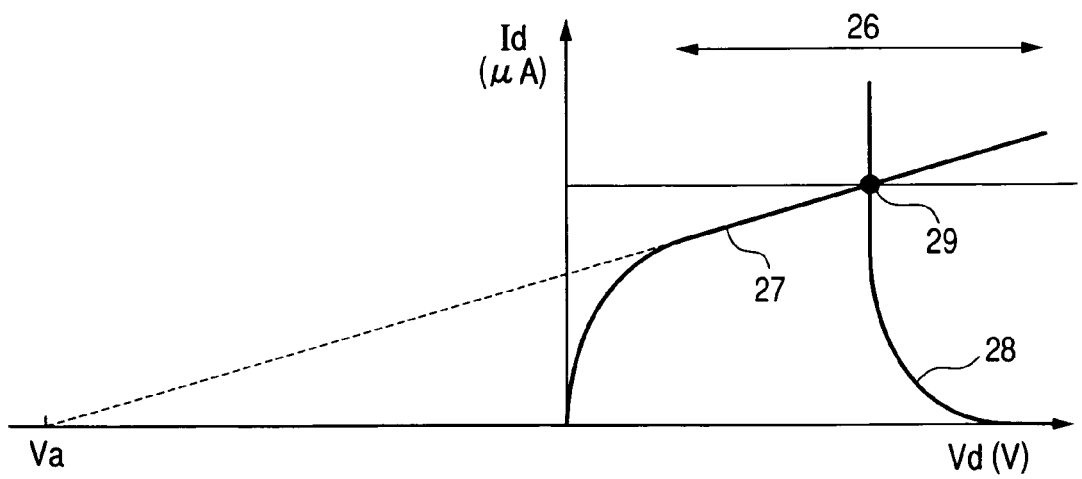
FIG. 5 is a view used to describe delivery of a current from the thin film transistor to the EL element.

In a saturation region 26 shown in FIG. 5, the position of an operating point 29, which is the intersection of a characteristic curve 27 of the driving thin film transistor and a characteristic curve 28 of the EL element, represents the drain current 23 that flows in the schematic view of FIG. 4. Hence, it is understood that when the gradient of the thin film transistor characteristic curve 27 is large in the saturation region 26 in FIG. 5, a mere slight shift of the thin film transistor characteristic curve 27 in the horizontal direction can cause the drain current 23 to vary markedly. The most ideal characteristic is a characteristic that the gradient of the thin film transistor characteristic curve 27 in the saturation region 26 in FIG. 5 is flat. In this instance, even when the thin film transistor characteristic curve 27 shifts in the horizontal direction, the magnitude of the drain current 23 remains unsusceptible. Hence, a variation of the thin film transistor characteristic does not give adverse influences, such as a variation of the current value and the light emitting luminance.

Herein, the thin film transistor characteristic curve 27 in the saturation region 26 in FIG. 5 may be extrapolated. Then, given Va as a drain voltage on which the drain current reaches 0 A, the voltage Va can be used as the index indicating a quantity of change of drain current with respect to a drain voltage in the saturation region of the thin film transistor. In this case, as the absolute value of the voltage value Va becomes larger, the gradient of the thin film transistor characteristic curve 27 in the saturation region 26 becomes smaller, and so does a change of drain current with respect to a drain voltage.

Figure 6:
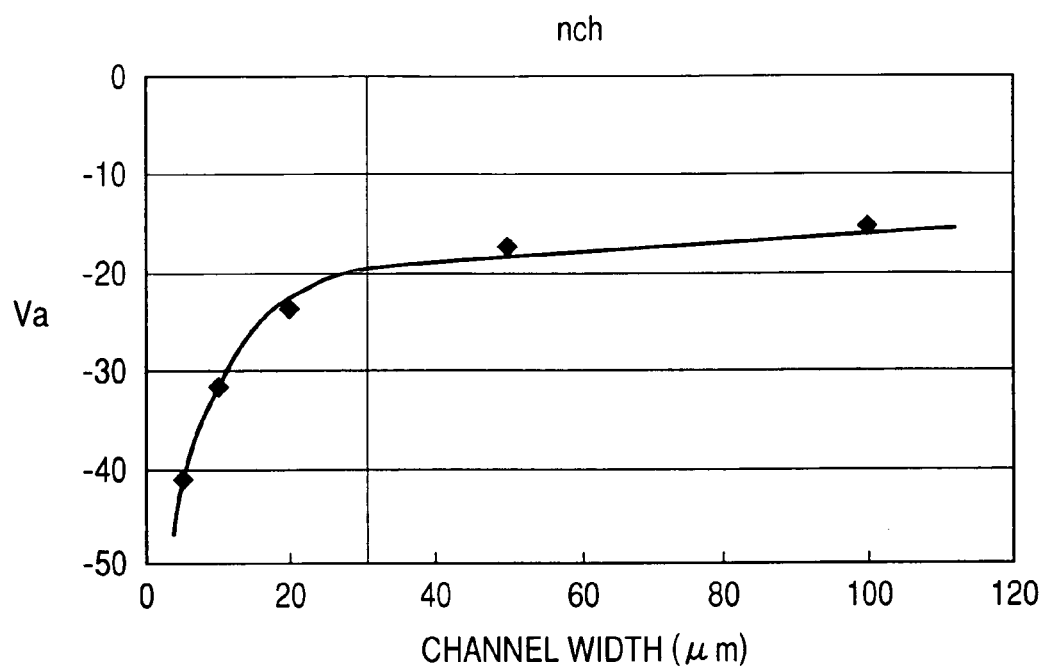
FIG. 6 is a graph showing the dependence of Va and a channel width in an n-type thin film transistor of the invention.
Figure 7:
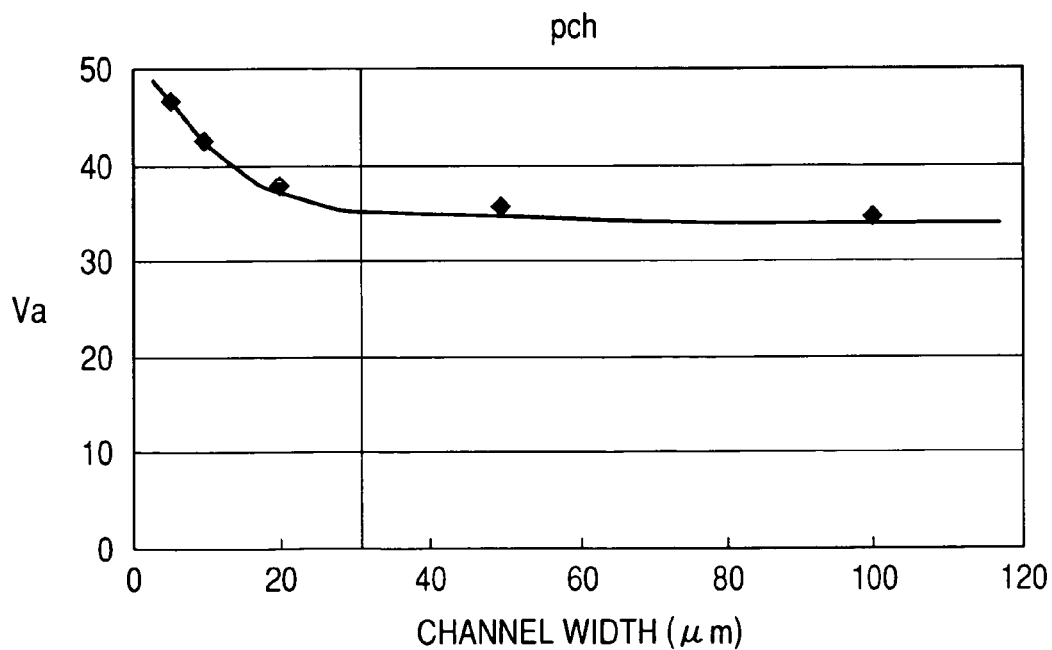
FIG. 7 is a graph showing the dependence of Va and a channel width in a p-type thin film transistor of the invention.

In order to confirm the effect of the thin film transistor of the invention, Va was measured by varying the channel width, which is the width of the channel region. The method as follows was adopted to vary the channel width. That is, a thin film transistor having a channel width of 100 μm was formed first. Subsequently, the channel region was divided by providing the slit-shaped openings 13 in the channel region 7a of the polysilicon film 7. A thin film transistor provided with plural channel regions 7a was thus fabricated. In this instance, the width of each channel region and the number of the channel regions were adjusted so that a sum of the widths of all the channel regions became exactly 100 μm. Two types of transistors including the n-type and the p-type were fabricated and 20 μm was given as the channel length. An applied gate voltage was adjusted to a voltage on which 1 μA was obtained as a quantity of current flowing between the source 21c and the drain 21a with the diode characteristic when the source 21c and the gate 21a were connected. Measurements were performed under the conditions as specified above, and FIG. 6 and FIG. 7 show the relation of Va and the width of each channel region. FIG. 6 shows the measurement result on an n-type TFT and FIG. 7 shows the measurement result on a p-type TFT.

For example, when compared with a case where the width was 100 μm because the channel was not divided, the absolute value of Va in the thin film transistor in which the channel regions was divided into 20 regions (the channel width of one channel region: 5 μm) shows a value 1.4 times higher and a value two or more times higher in the p-type transistor and the n-type transistor, respectively. It is thus confirmed that a quantity of change of drain current with respect to a drain voltage in the saturation region 26 of the thin film transistor is reduced, and influences of a variance of the thin film transistor characteristic can be therefore suppressed. It is also confirmed from FIG. 6 and FIG. 7 that it is sufficient to set the channel width W of each channel region to 30 μm or smaller in order to obtain the effect described above. Hence, by setting the channel width W, which is the width of each channel region as shown in FIG. 3, to 30 μm or smaller, it is possible to suppress a variation caused when a current is delivered to the EL element 22 in the saturation region 26 of the thin film transistor. This enables all the pixels to emit light at uniform luminance, which can in turn improve the display characteristic.

As has been described, it is possible to obtain a characteristic that a change of drain current with respect to a drain voltage in the saturation region of the thin film transistor is small by forming plural channel regions to lessen a quantity of current flowing through one channel region. The first embodiment has described an example where four channel regions 7a are formed by providing three openings 13 in the polysilicon film 7. However, as many channel regions as necessary can be formed to suit the situations, such as the limitation of the pattern area.

Because the plural channel regions 7a use the source region 7b and the drain region 7c in common, there is no need to increase the size of the transistor more than necessary. An efficient layout can be thus achieved. Further, because the source region 7b and the drain region 7c are formed as one unit, there is another effect that the area and the margin of placement can be increased when the contact holes are formed.

By using this thin film transistor as a driving thin film transistor that controls a minute quantity of current supplied to the organic light emitting layer, it is possible to obtain a thin film transistor in which a change of drain current with respect to a drain voltage in the saturation region of the thin film transistor is small. It is therefore possible to obtain an organic EL display device capable of controlling all the pixels to emit light at uniform luminance.

Besides the thin film transistor that drives the organic EL element, by configuring the thin film transistor to have a diode connection structure in which the gate electrode and the drain electrode are connected, and by applying the thin film transistor to a thin film transistor having the structure to correct the threshold voltage, it is possible to reduce irregular display caused by a variation of the characteristic of the thin film transistor. A display device with an excellent display characteristic can be thus achieved.

A manufacturing method of the thin film transistor will now be described in detail with reference to FIGS. 8A to 8F. FIGS. 8A to 8F are cross sections used to describe the manufacturing method of the thin film transistor according to the embodiments of the invention, and it is a view showing the sectional structure taken along the line A-A of FIG. 1 for each manufacturing step. The thin film transistor can be of an n-type, a p-type, or a combination thereof; however, for ease of description, a p-type transistor will be described by way of example.

Figure 8A:
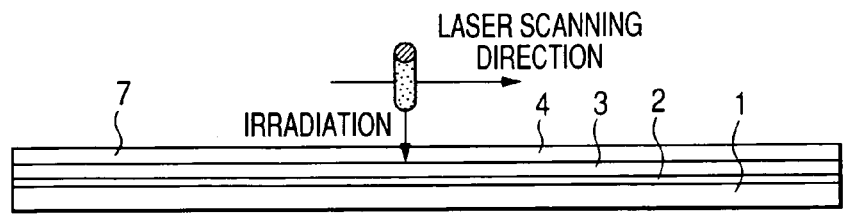
FIGS. 8A to 8F are cross sections in each step of a manufacturing method of the thin film transistor of the invention.

Referring to FIG. 8A, a SiN film 2, a SiO$_2$ film 3, and an amorphous silicon film 4 serving as primary insulation films are formed sequentially on the main surface of an insulation substrate 1 by means of plasma CVD (Chemical Vapor Deposition)

After the amorphous silicon film 4 is formed, heat treatment may be applied to reduce the concentration of H (hydrogen) contained in the amorphous silicon film 4. When hydrogen in the amorphous silicon film 4 boils abruptly during the subsequent laser annealing step, a crack may possibly occur in the silicon film. However, such a problem can be forestalled by performing the heat treatment before the laser annealing.

A laser beam from an excimer laser (wavelength: 308 nm) is then irradiated toward the amorphous silicon film 4. In this instance, a laser beam is converted to a linear beam profile by passing through a specific optical system first, and then it is irradiated toward the amorphous silicon film 4. The amorphous silicon film 4 is crystallized to form the polysilicon film 7 during this laser annealing step.

In this embodiment, the excimer laser is used to crystallize the amorphous silicon film 4. However, it is not limited to this method. For example, a YAG laser or a CW (Continuous-Wave laser) may be used, or alternatively, heat annealing may be applied. In the case of heat annealing, the polysilicon film 7 having a larger particle size can be obtained with the use of a catalyst, such as Ni (nickel).

Figure 8B:
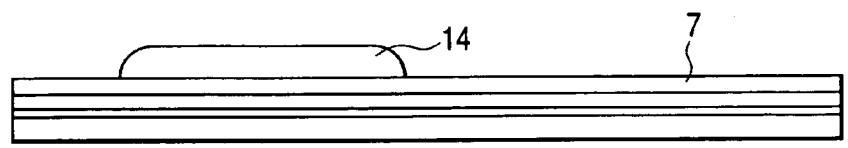
Figure 8C:
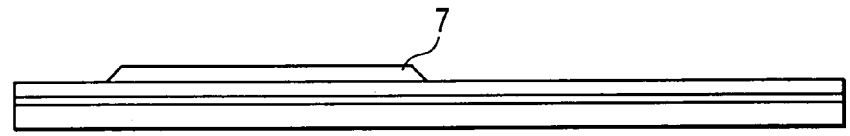

Referring to FIG. 8B, after a resist is applied on the polysilicon film 7, a resist film 14 having a specific pattern is formed in the photomechanical process. Referring to FIG. 8C, the polysilicon film 7 is etched using the resist film 14 as a mask to make the polysilicon film 7 into a specific shape as shown in FIG. 1, after which the resist film 14 is removed. The slit-shaped openings 13 in the channel region 7a are also formed in this step. Also, as is seen in FIG. 2, for the gate insulation film 5 to cover the polysilicon film 7 in a satisfactory manner, it is preferable to form the pattern end portions of the polysilicon film 7 in a tapered shape. To this end, it is recommended to apply dry etching by the resist back-step sequence using the RIE (Reactive Ion Etching) mode.

Figure 9:
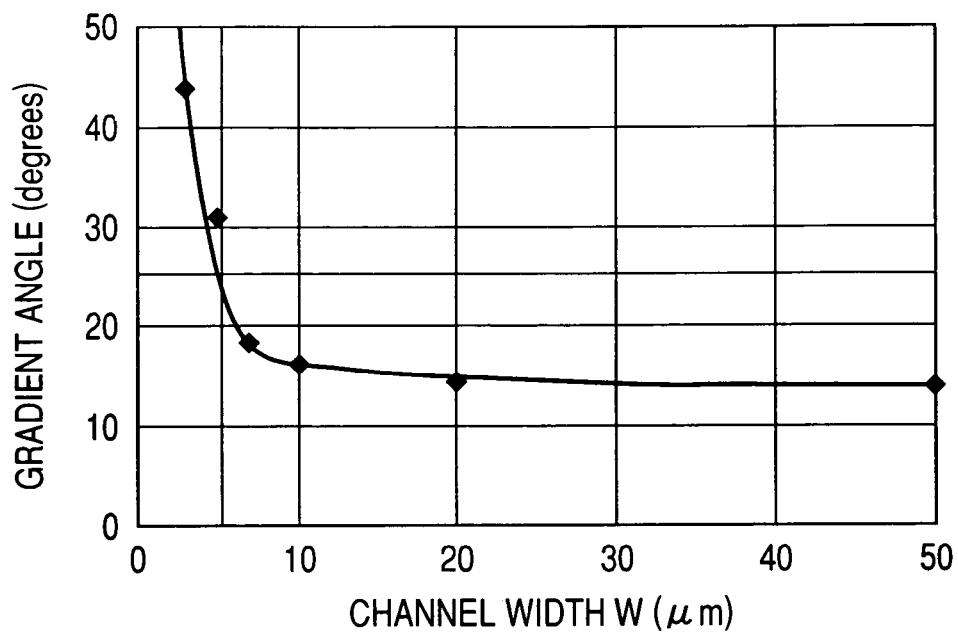
FIG. 9 is a graph showing a relation of a gradient angle of a polysilicon film with respect to a channel width of the invention.

FIG. 9 shows a relation of the channel width W of the channel region 7a and the gradient angle in the taper-shaped pattern end portions of the polysilicon film 7. Assume that the channel width W of each channel region 7a is smaller than 5 μm, then the gradient angle of the polysilicon film 7 tends to increase abruptly when the gradient angle reaches 25 degrees or larger. In this case, adverse influences are given to the covering performance of the gate insulation film 5, and the reliability of the thin film transistor may possibly be deteriorated. The reason why is thought as follows. That is, when the channel width to be formed is too narrow, the end portions per se of the resist film 14 are formed not in a tapered shape but in a perpendicular shape, which makes it difficult to apply the etching using the resist back-step process as described above. Meanwhile, when the channel width is 5 μm or larger, it is possible to control the gradient angle of the polysilicon film at or smaller than 25 degrees. It is thus possible to improve the covering performance of the gate insulation film as well as the reliability of the thin film transistor. Further, by setting the channel width of each channel region in a range of 5 μm to 30 μm both inclusive, it is possible to form a thin film transistor having not only the reliability but also the capability of suppressing the influences of a variation of the characteristic due to the effect of reducing the drain voltage dependence of a drain current.

Subsequently, the gate insulation film 5 having a thickness of about 100 nm is formed by means of CVD to cover the polysilicon film 7. In order to form the gate insulation film 5, for example, while the substrate having undergone the processing up to FIG. 8C is heated at about 350 degrees centigrade in a vacuum chamber, an internal pressure of the vacuum chamber is controlled to stay at 150 Pa by introducing 0.1 SLM of TEOS gas and 5 SLM of O$_2$ gas. Under this state, a plasma display is generated by applying RF power at 2000 W for an oxide silicon film to be deposited.

Figure 8D:
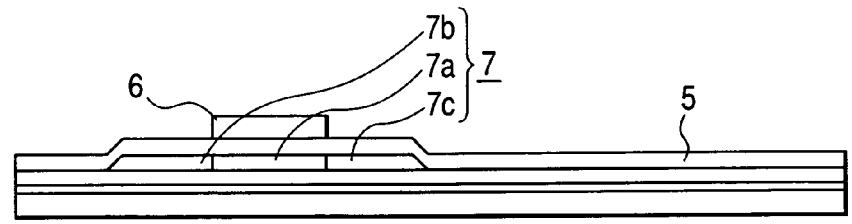

Referring to FIG. 8D, a metal film, from which the gate electrode 6 is formed, is deposited on the gate insulation film 5 by means of sputtering or the like. An unillustrated resist film having a specific opening pattern is formed on the metal film. The metal film is then etched using the resist film as a mask to form the gate electrode 6. The resist film is removed subsequently. The gate electrode 6 formed in this instance is formed to pass transversely across the openings 13 formed in the polysilicon film 7 as are shown in FIG. 1.

Boron is injected into the polysilicon film 7 at a specific dose amount by means of ion doping. In this instance, the gate electrode 6 serves as a mask. Hence, the source region 7b and the drain region 7c, which are conductive regions, are formed in the polysilicon film 7 as the boron is injected into the both ends of the polysilicon film 7. Also, the region into which no boron is injected due to the gate electrode 6 serving as the mask is used as the channel regions 7a. A known LDD region may be formed between the channel regions 7a and the conductive regions.

Figure 8E:
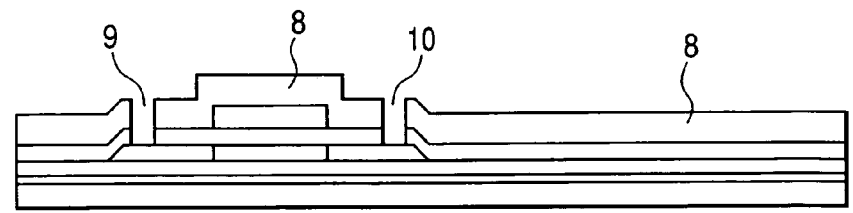

Referring to FIG. 8E, an inter-layer insulation film 8 used to cover the gate electrode 6 is formed on the gate insulation film 5. Subsequently, heat treatment at about 450 degrees centigrade is applied to active the doped ions. An unillustrated resist film having a specific opening pattern is formed on the inter-layer insulation film 8. The inter-layer insulation film 8 and the gate insulation film 5 are etched using the resist film as a mask to form contact holes 9 and 10 that reach the source region 7b and the drain region 7c, respectively. The resist film is removed subsequently.

Figure 8F:
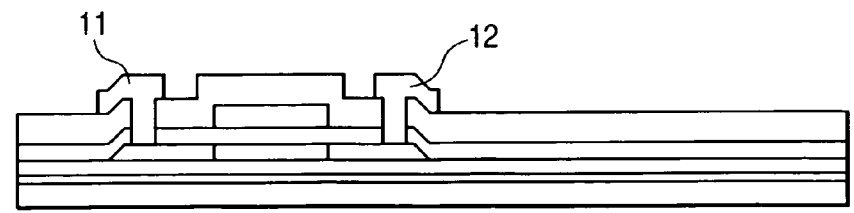

Referring to FIG. 8F, the contact holes 9 and 10 are filled and a source electrode 11 and a drain electrode 12 each having a specific shape as shown in FIG. 1 are formed on the inter-layer insulation film 8.

In this manner, the thin film transistor of the first embodiment is completed. The effect when this thin film transistor is applied to an organic field effect display device has been described above. Further, by providing a flat film having an opening above the drain electrode 12 on the top of the thin film transistor shown in FIG. 8F, an anode electrode on the flat film to be connected to the drain electrode 12, and an EL layer and a cathode electrode on the anode electrode followed by encapsulation, it is possible to fabricate an organic field effect display device.

Second Embodiment

Figure 10:
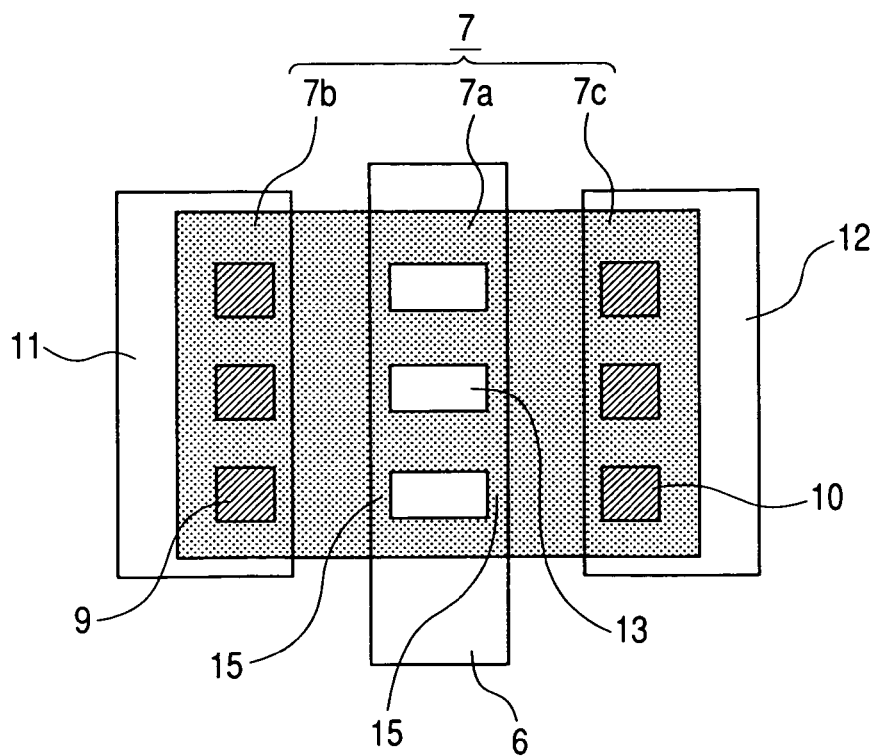
FIG. 10 is a plan view showing a thin film transistor according to a second embodiment of the invention.

In the first embodiment, the slit-shaped openings 13 formed in the channel region 7a are formed to pass transversely across the gate electrode 6. However, as is shown in FIG. 10, the slit-shaped openings 13 may be provided only to the region overlapping the gate electrode 6. Referring to FIG. 10, because no impurity is introduced in a region corresponding to the portion beneath the gate electrode 6, the difference from FIG. 1 is the presence of a channel region linking region 15 that is connected collectively to plural channel regions 7a and is also connected to the source region 7b or the drain region 7c, which are conductive regions. In other words, plural channel regions 7a are connected to the source region 7b or the drain region 7c, which are conductive regions, via the channel linking region 15 into which no impurity is doped. The same effect as the first embodiment can be achieved by the thin film transistor described in the second embodiment.

In addition, by making the channel length of the thin film transistor sufficiently long, a quantity of change of drain current with respect to a drain voltage in the saturation region of the thin film transistor characteristic can be lessened. Further, because the drain withstand voltage can be higher, the reliability of the thin film transistor can be improved.

The entire disclosure of Japanese Patent Application No. 2005-180994 filed on Jun. 21, 2005 including specification, claims, drawings and abstract is incorporated herein be reference in its entirety.

What is claimed is:

1. A thin film transistor comprising:
an insulation substrate;
a semiconductor layer formed on the insulation substrate including,
conductive regions including an impurity, and
a channel region sandwiched between the conductive regions;
an insulation layer that covers the semiconductor layer;
a gate electrode that is formed on the insulator layer at a position opposing the channel region; and
a source electrode and a drain electrode connected to the conductive regions,
wherein the channel region includes a plurality of openings so that a channel that links the conductive regions is divided into a plurality of connecting channel regions;
the gate electrode covers the openings of the channel region entirely; and
wherein a width of the gate electrode in a direction of a main current flow between the conductive regions is wider than a width of the openings in the channel regions and the connecting channel regions, so that a channel linking region is formed in the channel region that lies underneath the gate electrode, and the channel linking region is without impurities doped therein, and
wherein the semiconductor layer has impurities doped therein in an area other than an area that is underneath the gate electrode.

2. The thin film transistor according to claim 1, wherein the source electrode and the drain electrode are connected to the conductive regions through contact holes arranged in the insulation layer, and
wherein the plurality of channel regions are connected to the conductive regions.

3. The thin film transistor according to claim 1, wherein the plurality of channel regions and the conductive regions are electrically connected via a channel linking region arranged underneath the gate electrode.

4. The thin film transistor according to claim 1, wherein the drain electrode and the source electrode are connected to the conductive regions at a plurality of sections.

5. The thin film transistor according to claim 1, wherein a gradient angle of the semiconductor layer in the channel region is in a range from 5 degrees to 25 degrees.

6. The thin film transistor according to claim 1, wherein a lateral width of the connecting channel regions is in a range between 5 μm to 30 μm.

* * * * *